United States Patent
Kaplenko et al.

(10) Patent No.: US 11,901,155 B2
(45) Date of Patent: Feb. 13, 2024

(54) METHOD OF ALIGNING A CHARGED PARTICLE BEAM APPARATUS

(71) Applicant: FEI Company, Hillsboro, OR (US)

(72) Inventors: Mykola Kaplenko, Brno (CZ); Remco Schoenmakers, Eindhoven (NL); Oleksii Kaplenko, Brno (CZ); Ondrej Machek, Brno (CZ)

(73) Assignee: FEI Company, Hillsboro, OR (US)

( * ) Notice: Subject to any disclaimer, the term of this patent is extended or adjusted under 35 U.S.C. 154(b) by 18 days.

(21) Appl. No.: 17/392,752

(22) Filed: Aug. 3, 2021

(65) Prior Publication Data

US 2022/0037111 A1 Feb. 3, 2022

(30) Foreign Application Priority Data

Aug. 3, 2020 (EP) .................................... 20189256

(51) Int. Cl.
*H01J 37/26* (2006.01)
*G05B 13/02* (2006.01)

(52) U.S. Cl.
CPC .......... *H01J 37/265* (2013.01); *G05B 13/027* (2013.01); *H01J 2237/282* (2013.01)

(58) Field of Classification Search
CPC .. H01J 37/00; H01J 37/02; H01J 37/26; H01J 37/28; H01J 37/265; H01J 37/24; H01J 37/21; H01J 2237/282; H01J 2237/2826; H01J 2237/30427; H01J 2237/30433; G05B 13/027; G06N 3/0454
USPC ......................................... 250/306, 307, 311
See application file for complete search history.

(56) References Cited

U.S. PATENT DOCUMENTS

| | | | |
|---|---|---|---|
| 2006/0060781 A1* | 3/2006 | Watanabe ............ | B82Y 40/00 250/310 |
| 2015/0357157 A1* | 12/2015 | Mueller ................ | H01J 37/10 250/396 R |
| 2019/0004298 A1* | 1/2019 | Honjo .................. | H01J 37/222 |
| 2019/0355545 A1* | 11/2019 | Zeidler ................ | H01J 37/21 |

FOREIGN PATENT DOCUMENTS

EP 0145089 6/1985

* cited by examiner

*Primary Examiner* — Jason L McCormack (57) ABSTRACT

The disclosure relates to a method of aligning a charged particle beam apparatus, comprising the steps of providing a charged particle beam apparatus in a first alignment state; using an alignment algorithm, by a processing unit, for effecting an alignment transition from said first alignment state towards a second alignment state of said charged particle beam apparatus; and providing data related to said alignment transition to a modification algorithm for modifying said alignment algorithm in order to effect a modified alignment transition.

18 Claims, 5 Drawing Sheets

METHOD OF ALIGNING A CHARGED PARTICLE BEAM APPARATUS

FIELD OF THE INVENTION

The invention relates to a method of aligning a charged particle beam apparatus, as well as to a charged particle beam apparatus having a processing unit for performing such a method.

BACKGROUND OF THE INVENTION

A charged particle beam apparatus may in principle be any apparatus that uses charged particles, such as electrons, protons and/or ions, for generating a beam that is used, for example, to illuminate an object of interest. A charged particle beam may be used for studying a sample, inspecting an object, and/or removing parts of said object. Applications include, for example, Transmission Electron Microscopy, Scanning Electron Microscopy, (Plasma) Focused Ion Beam technology, and Lithography technology.

In many of these charged particle beam apparatuses, an alignment of the charged particle beam is necessary. For example, in Transmission Electron Microscopy (TEM) the electron beam needs to be focused such that the object of interested is illuminated with a parallel beam, and then the transmitted beam is focused onto a detector. In Scanning Electron Microscopy, the electron beam is focused into a small point onto the object, and the beam is scanned over the object and resulting secondary radiation is detected for examining the object of interest. For achieving high quality results, alignment of the charged particle beam apparatus is required.

Alignment of a charged particle beam apparatus has proven to be very difficult and requires a high level of expertise from an operator to be achieved in a quick and reliable manner. For example, in a TEM, the alignment involves one or more of the following parameters and operations: setting the gun and condenser system, condenser aperture, choose the specimen height (eucentric height), get the beam shifts and tilts pivoting correctly, get the beam tilted accurately down the optic axis of objective lens (rotation centre, objective aperture, if required), and refine the focus of the diffraction lens, correct astigmatism for each lens appropriately at each point. Alignment in a TEM may require a couple of iterations to achieve a desired end result, which takes a lot of time and is prone to making mistakes.

To this end, it is an object of the invention to provide a method with which the alignment of the charged particle beam apparatus is improved, in particular in terms of ease of use, accuracy and/or speed. It is furthermore an object of the invention to provide a charged particle beam apparatus that has the above qualities.

SUMMARY

Methods of aligning a charged particle beam apparatus according to the present disclosure include the step of providing a charged particle beam apparatus in a first alignment state. Said first alignment state generally is a state in which the charged particle beam apparatus, such as, for example, a charged particle microscope, is unaligned, i.e. not (optimally) aligned for carrying out the intended use of said charged particle beam apparatus.

The methods as defined herein comprises the step of using an alignment algorithm for effecting an alignment transition. Said alignment algorithm may be executed by a processing unit, which may be part of said charged particle beam apparatus, or may be externally connected thereto. The alignment algorithm brings said charged particle beam apparatus from said first alignment state towards a second alignment state. Generally, the second alignment state is an improved alignment state, i.e. a more (optimally) aligned state for carrying out the intended use of said charged particle beam apparatus, although this is not necessarily required. A more unaligned state is conceivable as well. The transition from said first alignment state towards said second alignment state is herein defined as the alignment transition.

In the methods as defined herein, data related to said alignment transition may be provided to a modification algorithm. Said data may include settings, speeds, timings and/or calibration results of said charged particle beam apparatus, for example, although other data related to any alignment state and/or configuration of said charged particle beam apparatus is conceivable as well. Data may include alignment states, alignment actions and corresponding quality parameters.

The modification algorithm as defined herein is arranged for modifying said alignment algorithm. The modified alignment algorithm is arranged in such a way that, starting from said first alignment state, a modified alignment transition takes place. The modified alignment transition may result in substantially the same, or at least very similar, second alignment state as an end-point of the alignment, but may differ in the intermediate steps to reach that second alignment state. Alternatively, the modified alignment transition may result in a modified second alignment state that is really different from said initial second alignment state. In this latter case, the modification algorithm is arranged for providing a modified alignment algorithm that results in a modified second alignment that is improved with respect to said initial second alignment.

Thus, by using the modification algorithm to modify the alignment algorithm, based on data obtained during an alignment transition from a first alignment state towards a second alignment state, an improved alignment algorithm is obtained with which the aligning of the charged particle beam apparatus can be executed in an improved way, resulting in a charged particle beam apparatus that has an improved second alignment state, or a more speedy alignment transition. With this, the object as defined herein is achieved. Advantageous embodiments of the disclosure will be described below.

In an embodiment, the alignment algorithm is a trainable decision-making algorithm that is arranged for inferring a sequence of alignment actions. The trainable decision-making algorithm, also referred to as agent, can be used by a processing unit to infer said sequence of alignment actions. In this embodiment, the inferred sequence of alignment actions is executed for bringing the charged particle beam apparatus to the second alignment state. Data related to said alignment transition, i.e. the change of the alignment state, can be stored for further use, such as, for example, modifying at least one of the agents.

The alignment transition may include a sequence of individual alignment timesteps. Data corresponding to a single alignment timestep, such as at least one of an alignment state, an alignment action and/or a quality parameter, may be stored in order to further use the stored data with a purpose of modification of the alignment algorithm.

The method steps mentioned above correspond, in an embodiment to a single iteration that may be repeated at least once in order to align a charged particle beam apparatus.

The method may comprise the step of modifying the alignment algorithm. The modification of the alignment algorithm may include using the data related to said alignment transition, i.e. the data related to the alignment state. It is noted that additional data may be used for modifying the alignment algorithm.

Modification, in this case, may be understood as the change of at least one of the hidden state, the activations, the trainable parameters or a structure of a machine learning model that underlies the alignment algorithm's decision-making mechanism. In the first two cases this means that the agent may use a recurrent or autoregressive model to infer the alignment actions. Such models may be utilized to perform the alignments, where the action inference requires not a single observation, but a history of past observations. Modification of the trainable weights and the modification of the structure of the machine learning model, however, may be performed offline meaning that the alignment is performed by the agent, that will be modified not during the alignment, but after the end of the alignment.

It is noted that the modifying of the alignment algorithm, or the agent, may include the following steps: providing the alignment algorithm, such as the agent; providing at least data of an alignment transition performed by said alignment algorithm; determining the required modification of said alignment algorithm, wherein use is made of said data of an alignment transition; and modifying the alignment algorithm based on said determined modification.

In an embodiment, the method comprises the further step of using said modified alignment algorithm for effecting a subsequent alignment transition. The subsequent alignment transition may be used for bringing said charged particle beam apparatus from said second alignment state to a third alignment state. Said third alignment state may have improved alignment characteristics compared to said second alignment state. In effect, the method as defined herein is at least partially repeated to bring the charged particle beam apparatus to a further improved alignment state. Data relating to said subsequent alignment transition may be provided to said modification algorithm for modifying said modified alignment algorithm in order to effect a further modified alignment transition. This allows the alignment algorithm to be checked, if desired, after each alignment procedure, and to be improved when necessary.

The alignment transition may comprise a plurality of individual alignment actions. This holds true, in principle, for any alignment transition as referred herein, such as the alignment transition, the modified alignment transition, the subsequent alignment transition. Each of these alignment transitions may comprise a series of individual alignment steps that are herein referred to as individual alignment actions. These individual alignment actions may, for example, include one or more of the following: setting the strength of a component of the charged particle beam apparatus, setting a position of an object of interest, setting a beam property such as a beam shift and/or beam tilt, setting a focus of one or more lenses, correcting for astigmatism for one or more lenses, and a choice of sequence of any of these individual actions or settings.

In an embodiment, the method comprises the step of determining a quality parameter. The quality parameter may relate to the final alignment state, such as the second alignment state, the third alignment state, etc. The quality parameter may also, or alternatively, relate to the alignment transition, or to one or more individual alignment actions thereof. It is conceivable that one or more quality parameters are determined for a single alignment transition. It is furthermore conceivable that one or more quality parameters are determined for a single individual alignment action.

In an embodiment, said step of determining said quality parameter includes assessing one or more of said plurality of individual alignment actions. This makes it possible to evaluate individual alignment actions, and associate a respective quality parameter to these. The modification algorithm may take these individual quality parameters into account when modifying the alignment algorithm.

Said assessing may comprises identifying individual alignment actions that result in desirable and/or undesirable alignment states. For example, individual alignment actions that resulted in improved alignment may be rewarded, and may be promoted in the modified alignment algorithm. Individual alignment actions that resulted in degraded alignment, however, may be punished, and may be prevented in the modified alignment algorithm. The assessing of individual alignment actions may identify those actions that lead away from a desired alignment, or that are slow, for example, and prevent those actions from being used in the modified alignment algorithm. Thus, the method may comprise the step of modifying said alignment algorithm such that undesirable alignment actions are prevented during use of said modified alignment algorithm.

In an embodiment, the alignment algorithm comprises at least one neural network. As known to those skilled in the art, a neural network (NN)—also referred to as artificial neural network (ANN) or simulated neural network (SNN)—is an interconnected group of artificial neurons that uses a mathematical or computational model for information processing based on a connectionistic approach to computation. The artificial neural network as defined herein is an adaptive system that changes its structure based on external or internal information that flows through the network. In more practical terms neural networks are non-linear statistical data modelling or decision making tools that can be used to model complex relationships between inputs and outputs or to find patterns in data. Learning in neural networks is particularly useful in applications where the complexity of the data or task makes the design of such functions by hand impractical. Thus, the application of a neural network is advantageous for optimizing the alignment procedure in any charged particle beam apparatus.

In particular, if said machine learning model is a neural network, said procedure of determining of the modification may consist in computation of the loss function and, subsequently, the computation of gradients of said loss function with respect to the trainable weights of the neural network.

Said modification of the agent may consist in the update of the trainable weights of the neural network using any classical optimizer (such as ADAM) based on the computed gradients.

Alternatively, a modification rule used by said procedure of modification may be given not in terms of a mathematical formula (such that used by classical neural network optimizers), but may be learned from data in the meta-loop of the training procedure.

In embodiments, the method may comprise the step of providing stored data acquired during alignment transitions. This allows to use on-policy, off-policy and offline reinforcement learning algorithms, for example.

The modification algorithm as defined herein may be a training algorithm for training the neural network. The modification algorithm may, in this sense, be a part of the neural network or may be an external algorithm that provides the required input for training the neural network. The data related to the alignment transition may be used as an input for training the neural network. Herein, the quality parameter related to the alignment transition and/or the individual alignment actions, may be used as a punish/reward mechanism for training the neural network. Retraining said at least one neural network may use one or more of said undesirable alignment states as an input parameter. The neural network may, in this regard, be trained by deep reinforcement learning, where the focus is on finding a balance between exploration (of uncharted territory) and exploitation (of current knowledge). In contrast to other types of learning, such as supervised learning and unsupervised learning, no labelled input/output pairs have to be presented, and in no sub-optimal actions need to be explicitly corrected.

Thus, in an embodiment, said step of modifying said algorithm comprises the step of training, or retraining, said at least one neural network, in particular using deep reinforcement learning.

It is conceivable that the charged particle beam apparatus is set to an undesirable alignment state, and that the modified alignment algorithm is used for effecting a further transition. The effecting of the further transition can then be mainly used for gathering further data, and using this data for once again modifying the (previously modified) alignment algorithm. It is furthermore conceivable that the undesirable alignment state relates to an alignment state wherein the alignment algorithm was found to be performing non-optimal.

In an embodiment, a training algorithm is provided, and said training algorithm is used for identifying and/or setting undesirable alignment states. The training algorithm makes it possible to quickly and effectively identify situations or alignment states that the alignment algorithm has difficulties with, and use exactly these difficult situations to test the alignment algorithm, gather data on the alignment transition, and use the modification algorithm for improving the alignment algorithm. In a sense, a two-step approach is used, wherein the training algorithm is used for identifying difficult alignment states, and the alignment algorithm is used for effectively aligning the charged particle beam apparatus starting from these difficult alignment states. When using a training neural network and an alignment neural network, they may be used to reinforce each other for quickly and effectively obtaining an accurate and fast alignment neural network.

According to an aspect, a method of training an alignment algorithm for aligning a charged particle beam apparatus is provided, comprising the steps of: providing an alignment algorithm to be trained; providing data related to an alignment transition of said charged particle beam apparatus, wherein said alignment transition extends from a first alignment state towards a second alignment state; and providing said data to a modification algorithm for modifying said alignment algorithm, wherein use is made of a processing unit.

Said method of training said alignment algorithm may be performed within said charged particle beam apparatus, for example internally in a processing unit of said charged particle beam apparatus. Additionally, or alternatively, at least part of said method of training may be performed externally. For example, it is conceivable that the method of training the alignment algorithm is performed in the cloud, or on a stand-alone computer device. In that case, the charged particle beam apparatus may transfer said data related to an alignment transition to said cloud or said computer, upon which the next step of providing said data to the modification algorithm may take place.

In embodiments, the method may comprise the step of providing stored data acquired during alignment transitions. This allows to use on-policy, off-policy and offline reinforcement learning algorithms, for example. The method of training the alignment algorithm may include, where relevant, one or more of the embodiments as described herein. The method may comprise, for example, the step of determining at least one quality parameter of said stored data, and modifying said alignment algorithm based on said at least one quality parameter.

In an embodiment, the method may comprise the step of providing stored data related to a plurality of alignment transitions of a plurality of charged particle beam apparatuses. This allows data to be gathered from a plurality of charged particle beam apparatuses, and this data can be used to modify a single alignment algorithm. This embodiment is in particularly useful in case the method of training said alignment algorithm is performed in the cloud or on a stand-alone computer. It effectively allows a vast amount of data to be provided to a single training algorithm, with which effective training of the algorithm is possible.

In an embodiment, wherein the method is performed externally from the charged particle beam apparatus, the modified alignment algorithm may be provided back to the respective charged particle beam apparatus as an update to the alignment algorithm. The modified alignment algorithm may be provided to a plurality of charged particle beam apparatuses as an update to the respective alignment algorithm as well. The modified alignment algorithm may comprise modifications that are specific to one of the plurality of charged particle beam apparatuses. Thus, the method as defined herein may comprise the step of providing a plurality of modified alignment algorithms.

It is noted that the charged particle beam apparatus may be a physical apparatus or a virtual device. A virtual device, such as for example a so-called digital twin, may advantageously be used to test the modified alignment algorithm and/or to generate a vast amount of alignment transition data that can be used for modifying said alignment algorithm, for example by training said alignment neural network.

According to an aspect, a charged particle beam apparatus is provided, comprising a processing unit that is arranged for performing at least part of the method as defined herein.

According to a further aspect, a method of misaligning a charged particle beam apparatus is provided, similar to the method as disclosed herein. According to this aspect, a charged particle beam apparatus is provided in a first alignment state, a misalignment algorithm is used, by a processing unit, for effecting an alignment transition from said first alignment state towards a second alignment state of said charged particle beam apparatus, wherein said second alignment state is more non-optimal compared to the first alignment state. In an embodiment, the alignment method as defined herein can be used to bring the charged particle beam apparatus into a more aligned state.

According to an aspect, said alignment algorithm and said misalignment algorithm are used for so-called curriculum training for improving at least one of said agents, i.e. at least one of said alignment algorithm and said misalignment algorithm. According to this aspect, a method of curriculum training is provided, wherein the following steps correspond to a single iteration that is executed at least once in order to improve at least one of the agents that are involved in said curriculum training: providing at least one charged particle beam apparatus; using a misalignment method, for example as defined herein, for misaligning said at least one charged particle beam apparatus, wherein use is made of at least a first agent; using an alignment method, for example as defined herein, for aligning said at least one charged particle beam apparatus, wherein use is made of at least a second agent; determining at least one quality parameter related to at least part of an alignment transition obtained during said misalignment and/or alignment transition; and modifying at least one of said first or said second agent based on said at least one determined quality parameter. It is noted that additional data may be used in said step of modifying said first or second agent.

The method of curriculum training may maintain two populations (also referred to as teams) of agents (algorithms). First team (also referred to as the alignment team) of the agents is trained to align a charged particle beam apparatus, whilst the second team (also referred to as the misalignment team) is trained to misalign the apparatus. Method of curriculum training is a zero-sum game. At each iteration, the alignment team agent performs the alignment of a charged particle beam apparatus. The quality parameters related to the performed alignment are computed. The misalignment team agent provides a charged particle beam apparatus to such a state that is difficult for the alignment team agent to perform the alignment from. The agents may be modified according to the following rule: Value of the utility function of the alignment team agent is computed based on the quality parameters related to the performed alignment. Value of the utility function of the misalignment team agent is a negative value of the utility function of the alignment team agent. Thus, the agents are trained in the adversarial manner. Competition between two teams of agents leads to the gradual improvement of the quality of actions performed by the agents.

The procedure of modification of the agents may be formulated as the reinforcement learning task. In this case, the computed quality parameters related to the performed alignment correspond to the rewards provided to the agent. Trainable parameters of the agents' neural networks are updated in such a way that the qualitative (highly rewarded) actions become more probable and the deficient (low rewarded) actions become less probable.

The value of the utility function of the misalignment team agents may be computed based on the quality parameters related to the misalignment actions performed by the agents. In this case the method of the curriculum training is not a zero-sum game any more.

The misalignment team of agents may be substituted by the hard-coded algorithm that does not comprise the trainable machine learning models. In this case, the method of curriculum training is reduced to the single-team population-based training task. In case that the population comprises only a single agent, the method of curriculum training is further reduced to a classical reinforcement learning formulation of the training procedure of the single agent.

Populations may comprise the agents with the same architectures of the neural networks and the agents with the different architectures. Each agent has the unique values of the trainable weights. Thus, each agent devises unique strategies (sequences of actions) in order to align or to misalign a charged particle beam apparatus.

Best of the trained agents can be selected at the end of the curriculum training procedure and can be further utilized to perform the alignment of the user charged particle beam apparatuses.

Embodiments of the disclosure provide a method of aligning a charged particle beam apparatus using a trainable sequential decision-making algorithm (an agent). Population of said agents is trained according to an iterative curriculum, leading to a gradual improvement of the quality of actions inferred by said agents in order to perform the alignment. Best of the trained agents undergo the deployment phase. Agents are further able to initiate the retraining procedure in order to adapt to peculiarities of a user charged particle beam apparatus. As described herein, data may include provided data and stored data.

Data provided to said modification algorithm may comprise the alignment trajectories drawn by the earlier versions of the provided agent (i.e. algorithm), drawn by other agents that are different from the agent provided to said modification algorithm or drawn by a demonstrator algorithm. Alignment trajectories may be drawn by interaction with multiple different charged particle beam apparatuses. Said earlier version of the agent is a state in which the agent was before one or more modifications performed by a modification algorithm. Said demonstrator algorithm is the algorithm that is able to infer the alignment actions that are different (potentially better) than the alignment actions inferred by a current version of the provided agent. Said demonstrator algorithm may be an agent that utilizes a machine learning model for action inference or, alternatively, the demonstrator algorithm may be a hard-coded algorithm utilizing the oracle knowledge in order to perform the alignment.

Provided data may comprise human expert demonstrations. Said human expert is a person who performed the alignment of a charged particle beam apparatus and whose actions were recorded and stored. In this case, the human expert alignment trajectories may be utilized in the training process in order to incorporate the human knowledge into the machine learning model that underlie the agent's inference mechanism.

Data provided to said modification algorithm may also comprise the data produced by an external algorithm for artificial data generation. Said external algorithm for artificial data generation is an algorithm that is able to produce data without physical interaction with a charged particle beam apparatus.

Provided data may further comprise the quality parameters corresponding to the alignment states and/or to the alignment actions. In particular, said quality parameters may be treated as the rewards provided to the agent in response to the alignment actions inferred by the agent during the alignment.

The structure of provided data can determine the structure of the modification algorithm. The modification algorithm may be organized as a supervised learning task in case that the provided data is labelled, as the unsupervised learning task in case that the data has no corresponding labels, as the active learning task in case that the provided data is partially labelled (i.e. agent requires the human to label not all data samples, but only the samples causing the unsureness during the action inference), as the self-supervised learning task in case that the agent is trained on the downstream tasks. In case that the provided data comprises the quality parameters, the modification algorithm may be organized as the reinforcement learning task. Said quality parameters may be treated as rewards provided to the agent in response to the alignment actions. In case that provided data comprises the alignment trajectories drawn by the current version of the agent, the on-policy reinforcement learning algorithms may be used in order to train the agent. The off-policy reinforcement learning algorithms may be used in case that the provided alignment trajectories were drawn by the previous versions of the agent. In case that the provided dataset is static (i.e. agent is not allowed to interact with an environment in order to collect more training data), the agent may be trained via the offline reinforcement learning.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Figure 1:
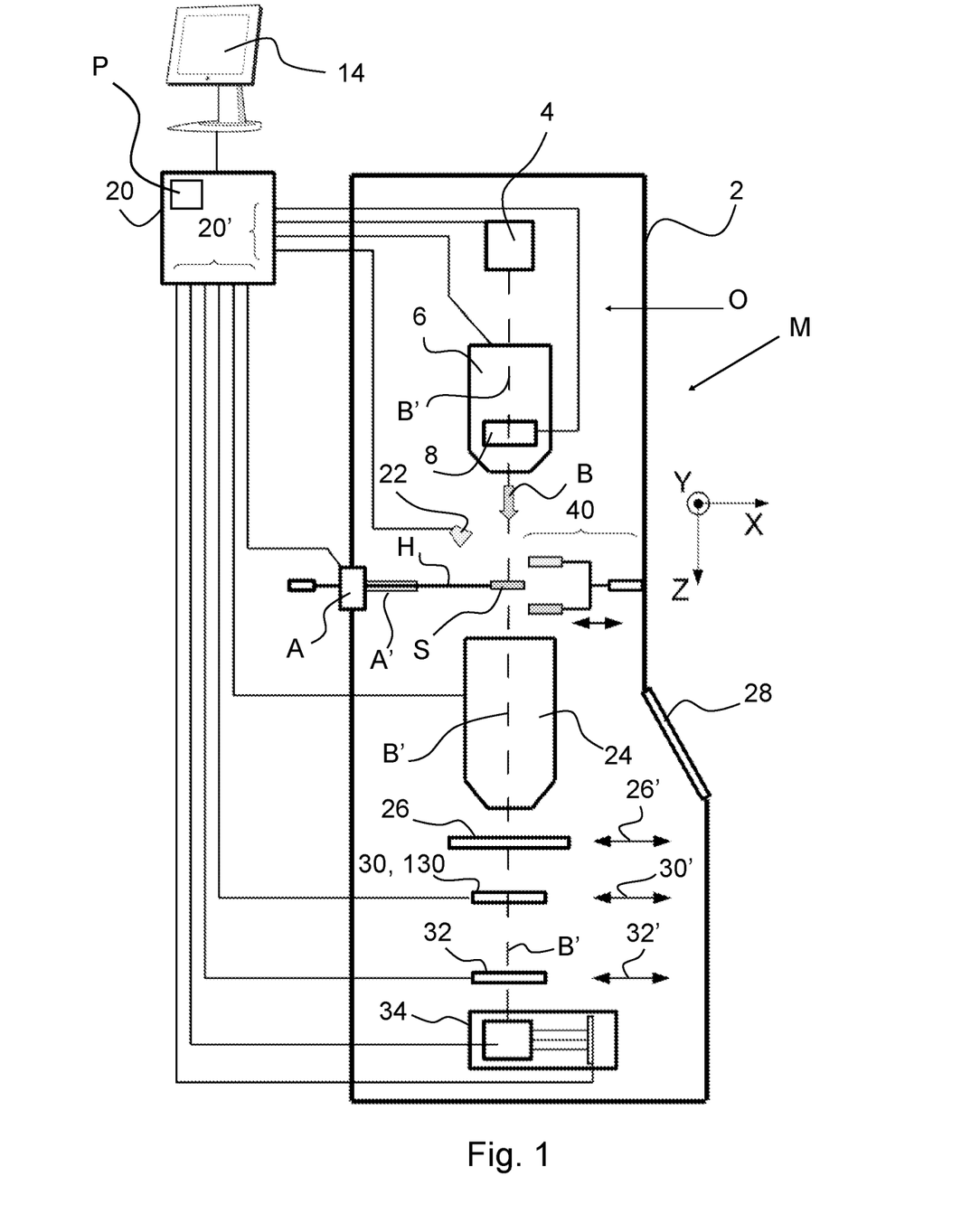
FIG. 1 shows a longitudinal cross-sectional view of a charged particle microscope according to a first embodiment of the invention.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as: TEM camera 30 and/or a STEM camera 32 At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.

An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use). As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
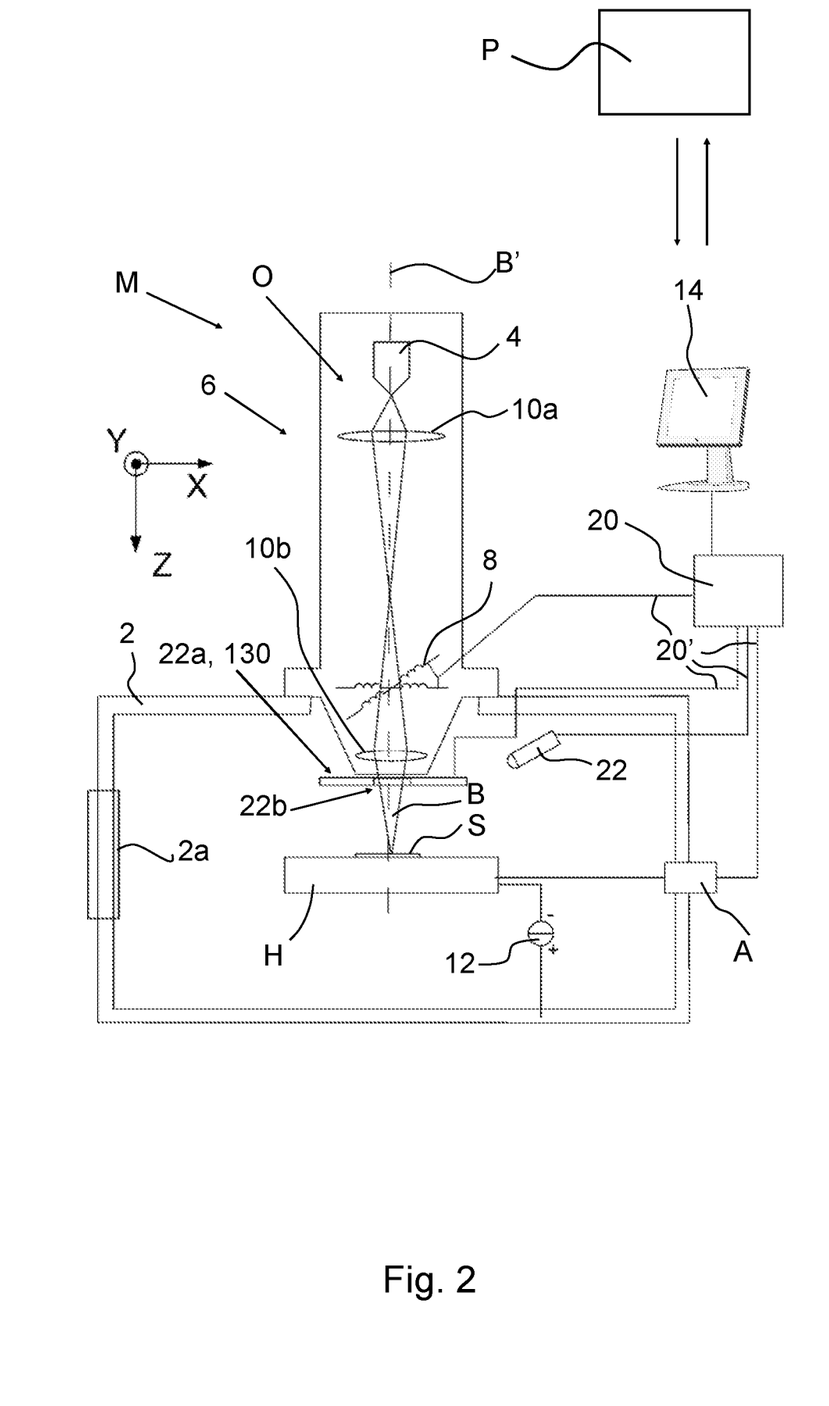
FIG. 2 shows a longitudinal cross-sectional view of a charged particle microscope according to a second embodiment of the invention.

Now referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts: 2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired; 10a, 10b: Schematically depicted lenses/optical elements in illuminator 6; 12: A voltage source, allowing the specimen holder H, or at least the specimen S, to be biased (floated) to an electrical potential with respect to ground, if desired; 14: A display, such as a FPD or CRT; 22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Here also, a controller 20 is present. The controller is connected to the display 14, and the display 14 may be connectable to a data processing apparatus P that is arranged for carrying out the method as defined herein. In the embodiment shown, the data processing apparatus P is a separate structure that does not form part of the controller, and does not even form part of the microscope P. The data processing apparatus P may be local or cloud-based, and is in principle not limited to any location. It is noted that in all embodiments described herein, the data processing unit P can be part of the charged particle beam apparatus, such as the charged particle microscope, or can be placed externally.

Figure 3A:
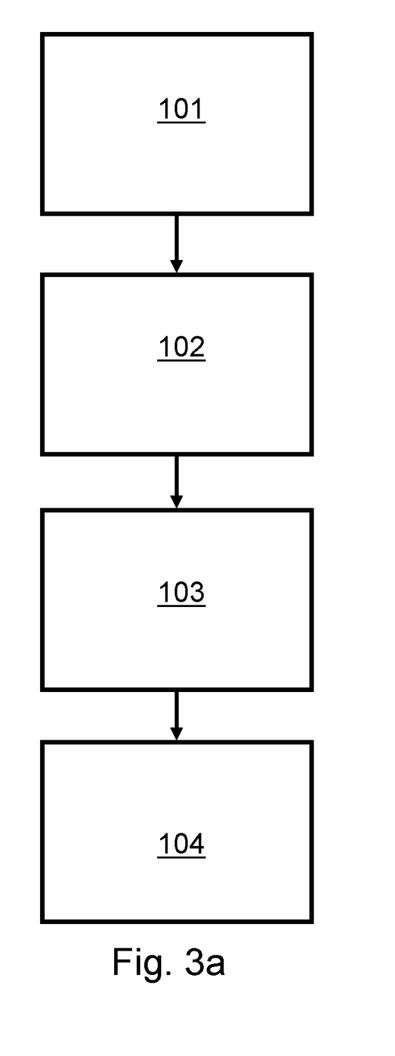
FIGS. 3a-3c show embodiments of the method as disclosed herein.

Now turning to FIG. 3a, an embodiment of the method as defined herein is schematically shown. The method comprises the steps of providing 101 a charged particle beam apparatus in a first alignment state; using an alignment algorithm 102, by a processing unit P, for effecting an alignment transition from said first alignment state towards a second alignment state of said charged particle beam apparatus; and providing 103 data related to said alignment transition to a modification algorithm for modifying said alignment algorithm in order to effect a modified alignment transition. In the embodiment shown, the method includes the step of modifying 104 said alignment algorithm, by a processing unit P, for obtaining a modified alignment algorithm.

The step of using 102 an alignment algorithm, by a processing unit P, can be performed, in an embodiment, by a processing unit P that is part of the charged particle beam apparatus. The step of providing 103 data related to said alignment transition to a modification algorithm is at least partly performed in the charged particle beam apparatus, and may include the step of providing data to outside of the charged particle beam apparatus. The step of modifying 104 said alignment algorithm may be done within the charged particle beam apparatus, but can be performed in the cloud or on an external computing device as well.

Figure 3B:
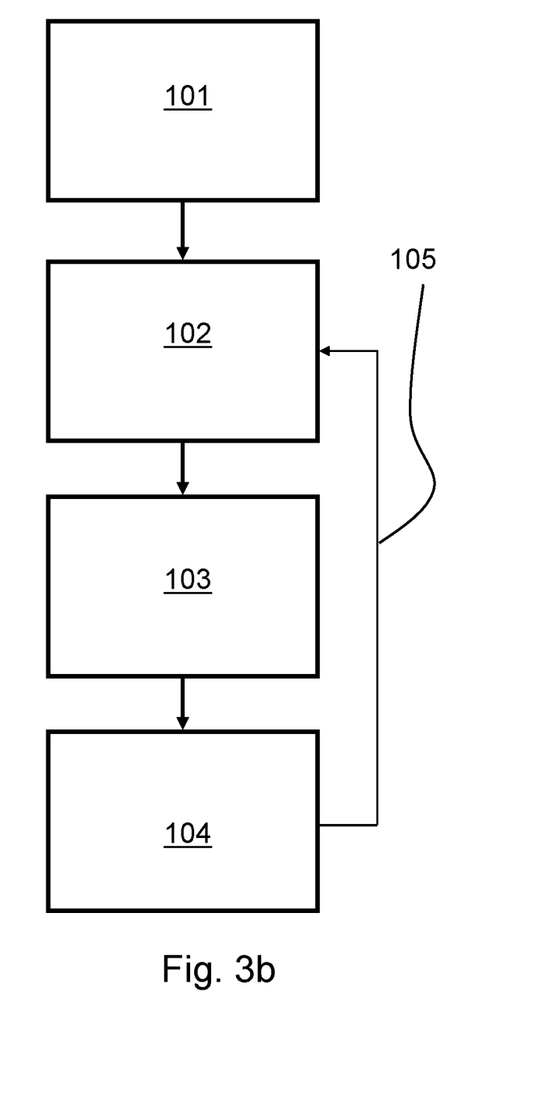

Now turning to FIG. 3b, a further embodiment of the method is shown. This method is comparable to the embodiment shown in FIG. 3a, but now includes the additional step of feeding back 105 the modified alignment algorithm (as obtained in step 104) to the charged particle beam apparatus, and using 102 the (now modified) alignment algorithm for establishing a further alignment transition.

Figure 3C:
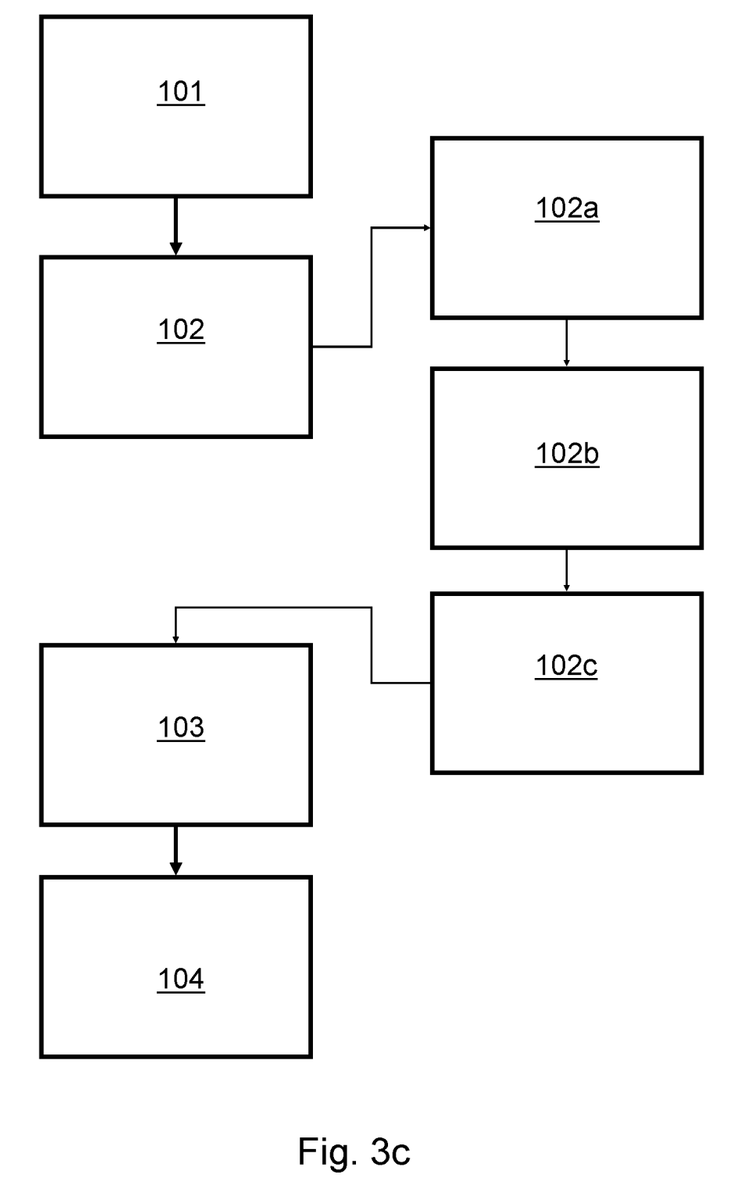

Now turning to FIG. 3c, a further embodiment of the method is shown. The method is comparable to the embodiment shown in FIG. 3a. However, here it is shown that the step of using an alignment algorithm 102, includes the sub-steps of providing 102a-102c a plurality of individual alignment actions. Here a total of three individual alignment actions 102a-102c are shown, but it will be clear to those skilled in the art that in principle any number of individual alignment actions is conceivable.

In all embodiments shown in FIG. 3a-3c, the method may include the step of determining a quality parameter. Said step of determining said quality parameter includes, in the embodiment shown in FIG. 3c, the step of assessing one or more of said plurality of individual alignment actions. Said assessing may comprise identifying individual alignment actions that result in undesirable alignment states. The method may comprise the step of modifying said alignment algorithm such that undesirable alignment actions are prevented during use of said modified alignment algorithm.

As described before, the alignment algorithm may comprise at least one neural network, and said step of modifying 104 said algorithm comprises the step of retraining said at least one neural network. This may include the step of retraining said at least one neural network using one or more of said undesirable alignment states.

In the embodiments shown, the step of providing a charged particle beam apparatus may include the step of setting said charged particle beam apparatus to an undesirable alignment state. Then the alignment algorithm (either modified or not) may be used to effect an alignment transition, or a further alignment transition. It is conceivable that use is made of a training algorithm for identifying and/or setting undesirable alignment states. Said training algorithm may comprise a neural network.

Figure 4:
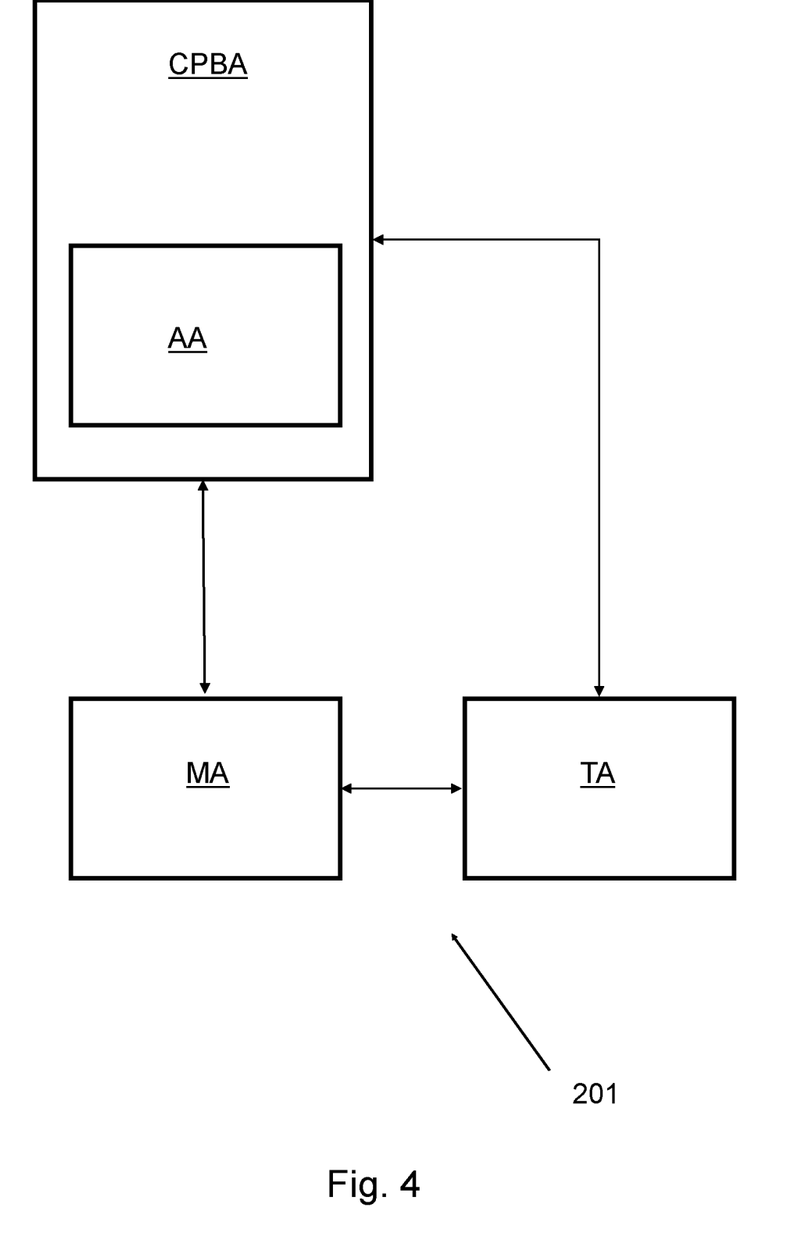
FIG. 4 shows an embodiment of a system as disclosed herein.

Now turning to FIG. 4, a system 201 as defined herein is shown. The system 201 comprises a charged particle beam apparatus CPBA, such as a charged particle microscope M, having an alignment algorithm AA for aligning the CPBA. The CPBA is connected to a modifying algorithm MA. The connection may be local, such as in the device itself, or external, such as a wireless connection to a cloud based modifying algorithm MA. The modifying algorithm may modify the aligning algorithm AA of the CPBA, based on data received by the CPBA, and return the modified algorithm to the CPBA. The training algorithm TA may be connected to the modifying algorithm MA and/or to the CPBA. Based on received data, the training algorithm TA is designed to select and/or set alignment states that are relatively hard for the alignment algorithm to solve. Then, a further alignment transition may take place, and the subsequent data may once more be used to check whether a further modification is necessary.

The CPBA as shown in FIG. 4 may be a system of a plurality of CPBAs. It is conceivable that a plurality of CPBAs, each having an (optional) alignment algorithm AA, are used to provide data to the modification algorithm MA. That data can be used to update or modify an existing alignment algorithm AA for one or more of the CPBAs.

The CPBA as shown in FIG. 4 may be a physical device, but can be a virtual device, such as a digital twin as well. The CPBA as shown in FIG. 4 may include at least one physical CPBA, and at least one virtual device. The at least one virtual device may be used for expedited training and/or modification of the alignment algorithm. The alignment algorithm and/or the training algorithm may be a neural network. In particular, the alignment algorithm is modified based on deep reinforcement learning.

From the above description of the figures, it is clear that a method as defined herein is related to training an alignment algorithm for aligning a charged particle beam apparatus, comprising the steps of: Providing an alignment algorithm AA to be trained; Providing data related to an alignment transition of said charged particle beam apparatus, wherein said alignment transition extends from a first alignment state towards a second alignment state; and Providing said data to a modification algorithm MA for modifying said alignment algorithm, wherein use is made of a processing unit P.

From the above description of the figures, it is clear that a charged particle beam apparatus, such as a charged particle microscope, is arranged for taking part in the method as described herein. The desired protection is conferred by the appended claims.

What is claimed is:

1. Method of aligning a charged particle beam apparatus, comprising the steps of:
   providing a charged particle beam apparatus in a first alignment state;
   using an alignment algorithm, by a processing unit, for effecting an alignment transition from said first alignment state towards a second alignment state of said charged particle beam apparatus, wherein the first alignment state and the second alignment state describe multiple operating parameters of multiple components of the charged particle beam apparatus, the multiple components including multiple lenses, and wherein said alignment algorithm comprises at least one neural network; and
   providing data related to said alignment transition to a modification algorithm for modifying said alignment algorithm in order to effect a modified alignment transition.

2. Method according to claim 1, further comprising the step of using said modified alignment algorithm for effecting a subsequent alignment transition.

3. Method according to claim 1, wherein said alignment transition comprises a plurality of individual alignment actions.

4. Method according to claim 3, comprising the step of determining a quality parameter.

5. Method according to claim 4, wherein said step of determining said quality parameter includes assessing one or more of said plurality of individual alignment actions.

6. Method according to claim 5, wherein said assessing comprises identifying individual alignment actions that result in undesirable alignment states.

7. Method according to claim 6, comprising the step of modifying said alignment algorithm such that undesirable alignment actions are prevented during use of said modified alignment algorithm.

8. Method according to claim 1, wherein said step of modifying said algorithm comprises the step of retraining said at least one neural network.

9. Method according to claim 8, comprising the steps of:
   identifying individual alignment actions that result in undesirable alignment states; and
   retraining said at least one neural network using one or more of said undesirable alignment states.

10. Method according to claim 9, comprising the step of setting said charged particle beam apparatus to an undesirable alignment state, and using said modified alignment algorithm for effecting a further transition.

11. Method according to claim 10, wherein use is made of a training algorithm for identifying and/or setting undesirable alignment states.

12. Method according to claim 11, wherein said training algorithm comprises a neural network.

13. Method of training an alignment algorithm for aligning a charged particle beam apparatus, comprising the steps of:
   providing an alignment algorithm to be trained, wherein said alignment algorithm comprises at least one neural network;
   providing data related to an alignment transition of said charged particle beam apparatus, wherein said alignment transition extends from a first alignment state towards a second alignment state, wherein the first alignment state and the second alignment state describe multiple operating parameters of multiple components of the charged particle beam apparatus, including multiple lenses; and
   providing said data to a modification algorithm for modifying said alignment algorithm.

14. Method according to claim 13, comprising a step of providing stored data related to a plurality of alignment transitions of a plurality of charged particle beam apparatuses.

15. Method according to claim 14, comprising a step of determining at least one quality parameter of said stored data, and modifying said alignment algorithm based on said at least one quality parameter.

16. Method according to claim 14, wherein said charged particle beam apparatus includes a virtual device, configured to expedite training and/or modification of the alignment algorithm.

17. Charged particle beam apparatus, comprising:
a charged particle emitter configured to emit a charged particle beam;
a specimen holder configured to hold a specimen;
wherein the charged particle beam apparatus is configured to operate in a plurality of alignment states;
one or more processors; and
a memory, wherein the memory stores non-transitory computer readable instructions that, when executed on the one or more processors, cause the system to:
cause the charged particle beam apparatus to operate in a first alignment state;
use an alignment algorithm to effect an alignment transition of the charged particle beam apparatus from said first alignment state towards a second alignment state of said charged particle beam apparatus, wherein the first alignment state and the second alignment state describe multiple operating parameters of multiple components of the charged particle beam apparatus, including multiple lenses, and wherein said alignment algorithm comprises at least one neural network; and
provide data related to said alignment transition to a modification algorithm for modifying said alignment algorithm in order to effect a modified alignment transition.

18. A computer readable medium storing non-transitory computer readable instructions that, when executed on one or more processors, cause the one or more processors to cause a charged particle microscope system to:
cause a charged particle beam apparatus to operate in a first alignment state;
use an alignment algorithm to effect an alignment transition of the charged particle beam apparatus from said first alignment state towards a second alignment state of said charged particle beam apparatus, wherein the first alignment state and the second alignment state describe multiple operating parameters of multiple components of the charged particle beam apparatus, including multiple lenses, and wherein said alignment algorithm comprises at least one neural network; and
provide data related to said alignment transition to a modification algorithm for modifying said alignment algorithm in order to effect a modified alignment transition.

* * * * *